(12) United States Patent
Narushima et al.

(10) Patent No.: US 7,090,741 B2
(45) Date of Patent: Aug. 15, 2006

(54) SEMICONDUCTOR PROCESSING SYSTEM

(75) Inventors: Masaki Narushima, Nirasaki (JP);
Hiroaki Saeki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 181 days.

(21) Appl. No.: 10/487,241

(22) PCT Filed: Aug. 29, 2002

(86) PCT No.: PCT/JP02/08747

§ 371 (c)(1),
(2), (4) Date: Feb. 27, 2004

(87) PCT Pub. No.: WO03/019648

PCT Pub. Date: Mar. 6, 2003

(65) Prior Publication Data

US 2005/0006230 A1 Jan. 13, 2005

(30) Foreign Application Priority Data

Aug. 31, 2001 (JP) .............................. 2001-264840

(51) Int. Cl.
*H01L 21/306* (2006.01)
*C23C 14/35* (2006.01)
*C23C 16/00* (2006.01)

(52) U.S. Cl. ...................... 156/345.26; 156/345.24; 156/345.31; 156/345.32; 118/719; 204/298.25

(58) Field of Classification Search ............ 204/298.25; 118/719; 156/345.24, 345.26, 345.31, 345.32
See application file for complete search history.

(56) References Cited

U.S. PATENT DOCUMENTS

| | | | |
|---|---|---|---|
| 4,851,101 A | 7/1989 | Hutchinson | ............ 204/298.09 |
| 5,186,718 A | 2/1993 | Tepman et al. | ............ 29/25.01 |
| 5,286,296 A * | 2/1994 | Sato et al. | ................... 118/719 |
| 5,310,410 A * | 5/1994 | Begin et al. | ............... 29/25.01 |
| 5,882,413 A | 3/1999 | Beaulieu et al. | ............ 118/719 |
| 6,440,261 B1 | 8/2002 | Tepman et al. | ............. 118/715 |
| 2002/0134506 A1* | 9/2002 | Franklin et al. | ........ 156/345.31 |

FOREIGN PATENT DOCUMENTS

| | | |
|---|---|---|
| JP | 8-288294 | 11/1996 |
| JP | 8-340036 | 12/1996 |
| JP | 10-270527 | * 9/1998 |

(Continued)

OTHER PUBLICATIONS

Machine Translation of 10-270527 and 11-230036.*

*Primary Examiner*—Rodney G. McDonald
(74) *Attorney, Agent, or Firm*—Oblon, Spivak, McClelland, Maier & Neustadt, P.C.

(57) ABSTRACT

A semiconductor processing system includes a common transfer chamber (34) having first and second compartments (46, 48) partitioned by a partition wall (44). First and second vacuum processing apparatuses (32E, 32A) are respectively connected to the first and second compartments (46, 48). A pressure control section (PCS) controls the pressures inside the first and second compartments (46, 48). The pressure control section (PCS) includes first and second vacuum pumps (68, 70) respectively connected to the first and second compartments (46, 48), and a line (76) connecting the delivery side of the second vacuum pump (70) to the suction side of the first vacuum pump (68). The pressure control section (PCS) performs a setting such that a second ultimate pressure or lowest operational pressure of the second compartment (48) is lower than a first ultimate pressure or lowest operational pressure of the first compartment (46).

20 Claims, 9 Drawing Sheets

FOREIGN PATENT DOCUMENTS

| | | |
|---|---|---|
| JP | 10-270527 | 10/1998 |
| JP | 11-230036 * | 8/1999 |
| JP | 2000-208589 | 7/2000 |
| JP | 2000-299367 | 10/2000 |
| JP | 2002-261148 | 9/2002 |

* cited by examiner

SEMICONDUCTOR PROCESSING SYSTEM

CROSS-REFERENCE TO RELATED DOCUMENTS

This is a U.S. national phase application under 35 U.S.C. § 371 of international application PCT/JP02/08747 (not published in English) filed Aug. 29, 2002.

TECHNICAL FIELD

The present invention relates to a semiconductor processing system having a plurality of vacuum processing apparatuses for performing predetermined processes on a target substrate, such as a semiconductor wafer. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

BACKGROUND ART

In the process of manufacturing semiconductor integrated circuits, a wafer is subjected to various processes, such as film-formation, etching, oxidation, and diffusion. Owing to the demands of increased miniaturization and integration of semiconductor integrated circuits, the throughput and yield involving these processes need to be increased. In light of this, there is a semiconductor processing system of the so-called cluster tool type, which has a plurality of process chambers for performing the same process, or a plurality of process chambers for performing different processes, connected to a common transfer chamber. With a system of this type, various steps can be performed in series, without exposing a wafer to air. For example, Jpn. Pat. Appln. KOKAI Publication Nos. 3-19252, 2000-208589 and 2000-299367 disclose a semiconductor processing system of the cluster tool type. The assignee of the present invention also filed Jpn. Pat. Appln. No. 2001-060968 disclosing an improved semi-conductor processing system of the cluster tool type.

Figure 11:
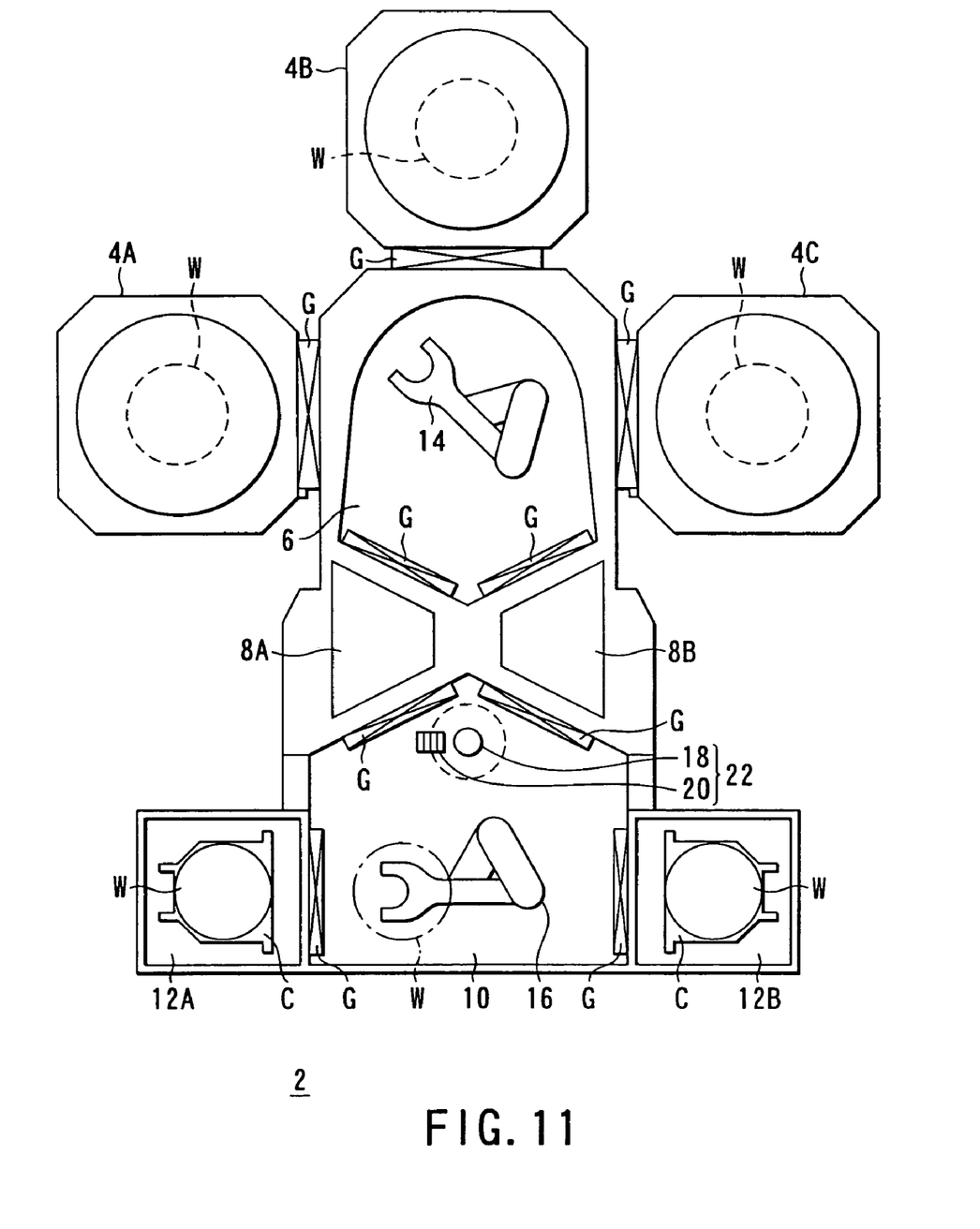
FIG. 11 is a schematic view showing the structure of a conventional processing system of the cluster tool type.

FIG. 11 is a schematic view showing the structure of a conventional processing system of the cluster tool type. As shown in FIG. 11, the processing system 2 includes three processing apparatuses 4A, 4B, and 4C, a first transfer chamber 6, two load-lock chambers 8A and 8B provided with a pre-heating mechanism or cooling mechanism, a second transfer chamber 10, and two cassette chambers 12A and 12B. The three processing apparatuses 4A to 4C are connected to the first transfer chamber 6 in common. The two load-lock chambers 8A and 8B are disposed in parallel with each other between the first and second transfer chambers 6 and 10. The two cassette chambers 12A and 12B are connected to the second transfer chamber 10. A gate valve G to be opened/closed is airtightly interposed between each two of the chambers.

The first and second transfer chambers 6 and 10 are respectively provided with first and second transfer arm devices 14 and 16 disposed therein, each of which is formed of an articulated structure that can extend, contract, and rotate. Each of the arm devices 14 and 16 is arranged to hold a semiconductor wafer W to transfer it. The second transfer chamber 10 is provided with an alignment mechanism 22 disposed therein, which is formed of a rotary table 18 and an optical sensor 20. The alignment mechanism 22 is arranged to rotate a wafer W transferred from the cassette chamber 12A or 12B, and detect its orientation flat or notch to perform alignment thereon.

When a semiconductor wafer W is processed, an unprocessed semiconductor wafer W is first taken out of a cassette C placed in one of the cassette chambers, e.g., a cassette chamber 12A, by the second transfer arm device 16 disposed in the second transfer chamber 10, which has been kept at atmospheric pressure with an $N_2$ atmosphere. Then, the wafer W is transferred by the arm device 16 and placed on the rotary table 18 of the alignment mechanism 22 disposed in the second transfer chamber 10. The arm device 16 is kept stationary on standby while the rotary table 18 rotates to perform alignment. The time period necessary for this alignment operation is, e.g., about 10 to 20 seconds.

After the alignment operation, the aligned wafer W is held again by the arm device 16, which has been waiting, and transferred into one of the load-lock chambers, e.g., the chamber 8A. The wafer is pre-heated in the load-lock chamber 8A, as needed, and, at the same time, the interior of the load-lock chamber 8A is vacuum-exhausted to a predetermined pressure. The time period necessary for performing this pre-heating or vacuum-exhaust is, e.g., about 30 to 40 seconds.

After the pre-heating operation, the gate valve G between the load-lock chamber 8A and the first transfer chamber 6, which is set at vacuum in advance, is opened to make them communicate with each other. Then, the pre-heated wafer W is held by the first transfer arm device 14 and transferred into a predetermined processing apparatus, e.g., 4A. Then, a predetermined process, such as a film-formation process of a metal film, insulating film, or the like, is performed in the processing apparatus 4A. The time period necessary for performing this process is, e.g., about 60 to 90 seconds.

The processed semiconductor wafer W is transferred, through a route reverse to the route described above, to, e.g., the original cassette C placed in the cassette chamber 12A. In this route to return the processed wafer W, the other load-lock chamber 8B is used, for example, and the wafer W is transferred after it is cooled to a predetermined temperature. The time period necessary for performing this cooling and returning to atmospheric pressure is about 30 to 40 seconds. Before the processed wafer W is transferred into the cassette C, alignment may be performed by the alignment mechanism 22, as needed.

As semiconductor wafer processes progress in level of miniaturization and integration, decrease in film thickness, and increase in the number of layers, integrated circuits are increasingly required to have diversified functions. As a result, manufacture of semiconductor integrated circuits tends to shift from small item large volume production to large item small volume production. This makes it necessary to provide one semiconductor processing system with a plurality of processing apparatuses using different process conditions.

For example, the semiconductor vacuum process includes a process performed in a relatively high vacuum state, such as a process using plasma, and a process performed in a state whose vacuum level is not so high, such as a pre-cleaning process for deoxidizing an oxide film on a semiconductor wafer surface. If processing apparatuses for performing processes under vacuum but at different process pressures, as described above, are connected to the common transfer chamber 6, as shown in FIG. 11, a problem arises such that it takes time to adjust pressure in the chambers when a wafer is transferred between the common transfer chamber 6 and the processing apparatuses using different process pressures.

DISCLOSURE OF INVENTION

Accordingly, an object of the present invention is to provide a semiconductor processing system in which a plurality of processing apparatuses using different process pressures are connected to a common transfer chamber, but it does not take time to adjust pressure.

According to a first aspect of the present invention, there is provided a semiconductor processing system comprising:

an airtight common transfer chamber;

a partition wall that partitions an interior of the common transfer chamber and forms first and second compartments inside the common transfer chamber, the partition wall including a gate valve configured to selectively cause the first and second compartments to communicate with each other;

a first vacuum processing apparatus connected to the first compartment, and configured to process a target substrate at a first process pressure therein;

a second vacuum processing apparatus connected to the second compartment, and configured to process the target substrate at a second process pressure therein, the second process pressure being lower than the first process pressure;

first and second load-lock chambers configured to adjust pressure therein, and connected to the first compartment;

a first transfer arm device disposed in the first compartment to transfer the target substrate into the first vacuum processing apparatus;

a second transfer arm device disposed in the second compartment to transfer the target substrate into the second vacuum processing apparatus;

a buffer disposed within at least one of the first and second compartments to temporarily hold the target substrate, and located to be accessible by the first and second transfer arm devices; and a pressure control section configured to control pressure inside the first and second compartments, wherein the pressure control section comprises first and second vacuum pumps respectively connected to the first and second compartments, and a line connecting a delivery side of the second vacuum pump to a suction side of the first vacuum pump, and performs a setting such that a second ultimate pressure, which is a lowest operational pressure of the second compartment, is lower than a first ultimate pressure, which is a lowest operational pressure of the first compartment.

According to a second aspect of the present invention, there is provided a semiconductor processing system comprising:

an airtight common transfer chamber;

a partition wall that partitions an interior of the common transfer chamber and forms first and second compartments inside the common transfer chamber, the partition wall including a gate valve configured to selectively cause the first and second compartments to communicate with each other;

first and second vacuum processing apparatuses respectively connected to the first and second compartments;

first and second load-lock chambers configured to adjust pressure therein, and connected to the first compartment;

first and second transfer arm devices respectively disposed in the first and second compartments to transfer the target substrate into the first and second vacuum processing apparatuses;

a buffer disposed within at least one of the first and second compartments to temporarily hold the target substrate, and located to be accessible by the first and second transfer arm devices; and a pressure control section configured to control pressure inside the first and second compartments, and comprising first and second vacuum pumps respectively connected to the first and second compartments.

BEST MODE FOR CARRYING OUT THE INVENTION

Embodiments of the present invention will be described hereinafter with reference to the accompanying drawings. In the following description, the constituent elements having substantially the same function and arrangement are denoted by the same reference numerals, and a repetitive description will be made only when necessary.

Figure 1:
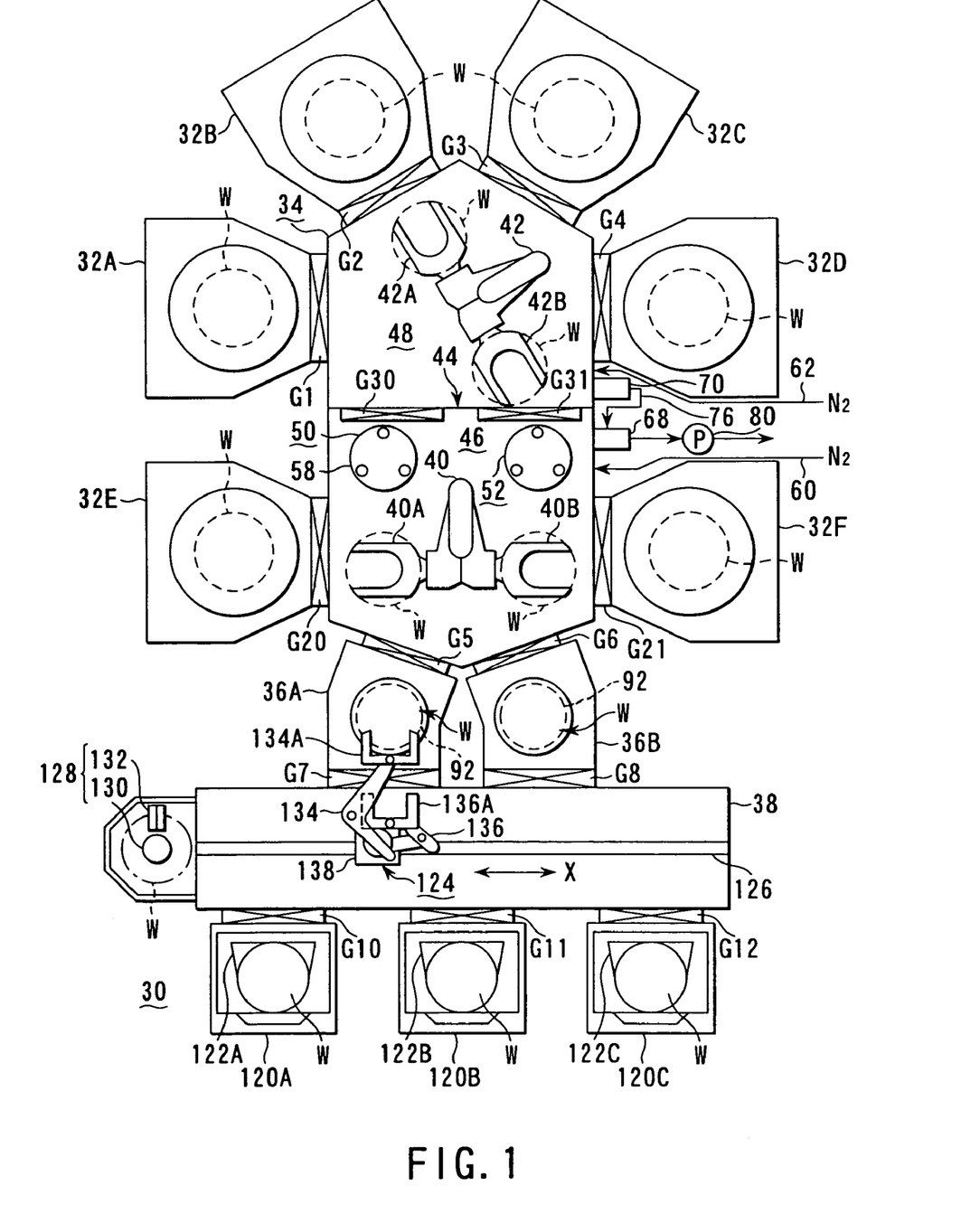
FIG. 1 is a schematic plan view showing a semiconductor processing system according to an embodiment of the present invention.
Figure 2:
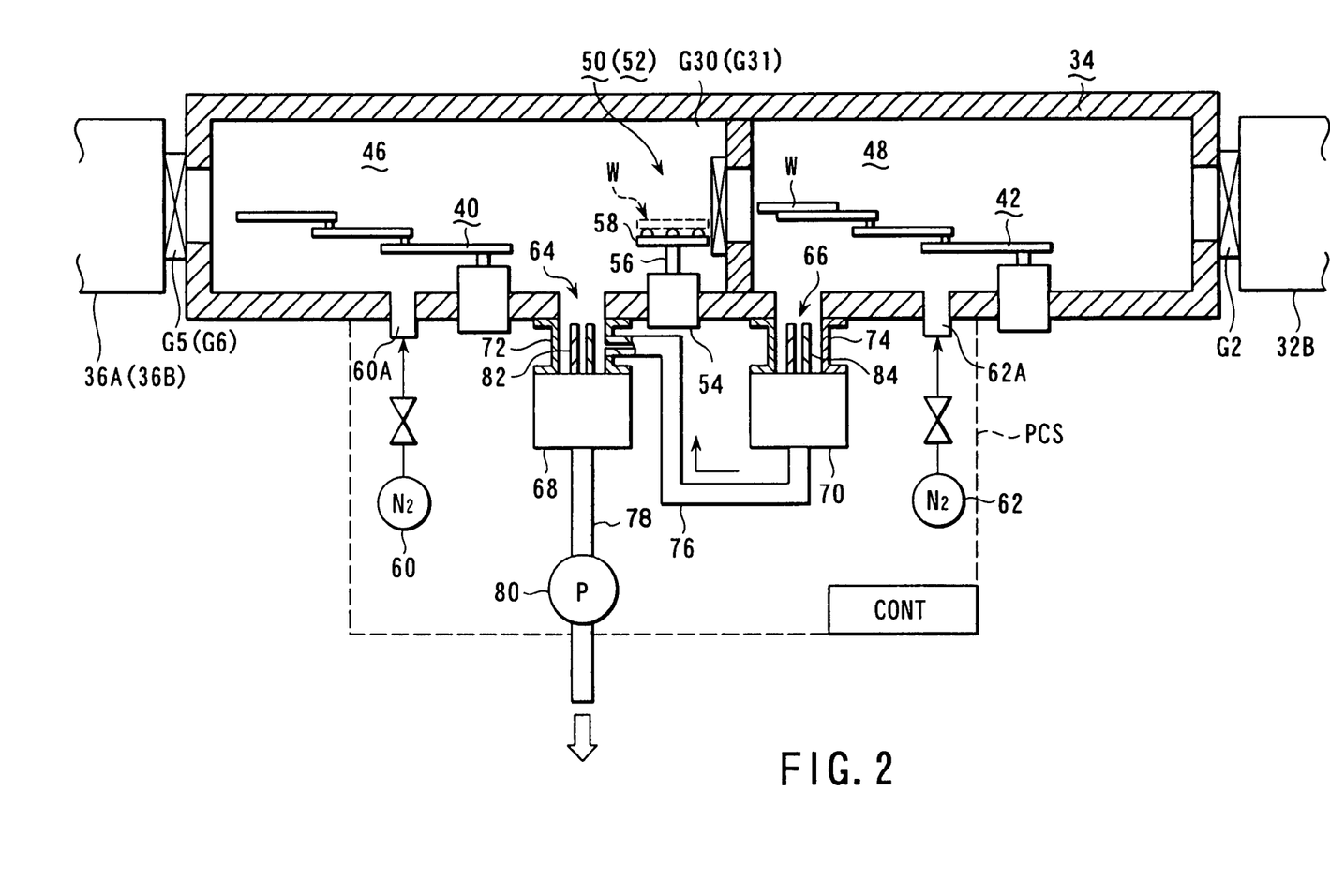
FIG. 2 is a sectional view showing the common transfer chamber of the processing system shown in FIG. 1.

FIG. 1 is a schematic plan view showing a semiconductor processing system according to an embodiment of the present invention. FIG. 2 is a sectional view showing the common transfer chamber of the processing system shown in FIG. 1.

As shown in FIG. 1, this processing system 30 includes a plurality of, e.g., six, vacuum processing apparatuses 32A, 32B, 32C, 32D, 32E, and 32F. These six vacuum processing apparatuses are connected to an airtight common transfer chamber 34 having an elongated polygonal shape, so that a system of the cluster tool type is formed. The common transfer chamber 34 is connected to an elongated entrance transfer chamber 38 through first and second load-lock chambers 36A and 36B.

More specifically, the common transfer chamber 34 has a polygonal shape with a pair of opposite sides longer than the other sides, e.g., a compressed hexagonal shape in this illustrated example. The first and second load-lock chambers 36A and 36B are connected to two sides of the common transfer chamber 34 adjacent to the entrance transfer chamber 38. The vacuum processing apparatuses 32A to 32F are connected to other four sides of the common transfer chamber 34.

Gate valves G1 to G4, G20, G21, G5, and G6 to be airtightly opened/closed are interposed between the common transfer chamber 34 and six vacuum processing apparatuses 32A to 32F, and between the common transfer chamber 34 and first and second load-lock chambers 36A and 36B, respectively. Gate valves G7 and G8 to be airtightly opened/closed are also interposed between the first and second load-lock chambers 36A and 36B and entrance transfer chamber 38, respectively. When the corresponding one of the gate valves is opened, two adjacent chambers of the common transfer chamber 34, vacuum processing apparatuses 32A to 32F, load-lock chambers 36A and 36B, and entrance transfer chamber 38 communicate with each other and allow a wafer W to be transferred therebetween.

The common transfer chamber 34 is provided with a partition wall 44 that airtightly divides the interior of the common transfer chamber 34 into first and second compartments 46 and 48. The partition wall 44 is disposed across the center of the longitudinal direction of the common transfer chamber 34. The partition wall 44 has two gate valves G30 and G31 to be airtightly opened/closed, on left and right sides. When either of the gate valves G30 and G31 is opened, the first and second compartments 46 and 48 communicate with each other and allow a wafer W to be transferred therebetween.

Since the first and second compartments 46 and 48 are partitioned by a single layer of the gate valves G30 and G31, the structure of the common transfer chamber 34 becomes simple, and the process throughput improves. However, in this case, the difference between the operational pressures of the first and second compartments 46 and 48 should not be set too large.

Under the control of a pressure control section PCS described later, it is set such that the lowest operational pressure (ultimate pressure) of the second compartment 48 is lower (higher in vacuum) than the lowest operational pressure (ultimate pressure) of the first compartment 46. Two vacuum processing apparatuses are connected to the first compartment 46, while four vacuum processing apparatuses 32A to 32D are connected to the second compartment 48. The four vacuum processing apparatuses 32A to 32D respectively perform semiconductor processes at process pressures lower (higher in vacuum) than those of the two vacuum processing apparatuses 32E and 32F.

The first compartment 46 is provided with a first transfer arm device 40 disposed therein, which has an articulated arm structure that can extend, contract, move up and down, and rotate. The first transfer arm device 40 has two picks 40A and 40B that can extend and contract in opposite directions independently of each other, so that it can handle two wafers at a time. The first transfer arm device 40 is arranged to access the two load-lock chambers 36A and 36B and the two vacuum processing apparatuses 32E and 32F.

The second compartment 48 is provided with a second transfer arm device 42 disposed therein, which has an articulated arm structure that can extend, contract, move up and down, and rotate. The second transfer arm device 42 also has two picks 42A and 42B that can extend and contract in opposite directions independently of each other, so that it can handle two wafers at a time. The second transfer arm device 42 is arranged to access the four vacuum processing apparatuses 32A to 32D. Each of the first and second transfer arm devices 40 and 42 may be configured to have only one pick.

Two buffers 50 and 52 each for temporarily holding a wafer W are disposed within that area (accessible area) in the first compartment 46 where the transfer ranges of the first and second transfer arm devices 40 and 42 overlap with each other, and specifically almost midway between the first and second transfer arm devices 40 and 42. Since the two buffers 50 and 52 have the same structure, an explanation will be given of only one of them, e.g., the buffer 50, as an example.

Figure 3:
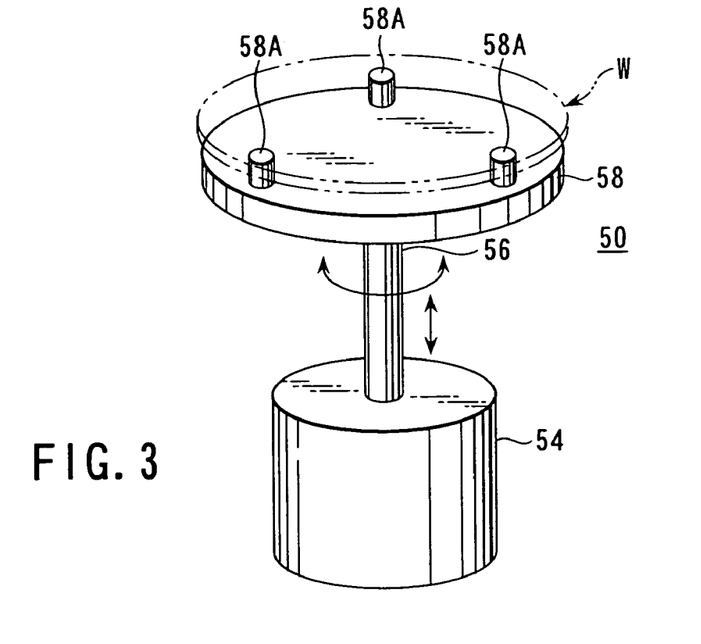
FIG. 3 is a perspective view showing a buffer disposed in the common transfer chamber shown in FIG. 2.

FIG. 3 is a perspective view showing the buffer 50(52) disposed in the common transfer chamber 34 shown in FIG. 2. As shown in FIGS. 2 and 3, the buffer 50 includes an actuator 54 with a driving shaft 56, and a rotary table 58 connected to the top of the driving shaft 56. The rotary table 58 is provided with, e.g., three in this example, projections 58A on the surface, which support the bottom of a wafer W thereon. The driving shaft 56 can move up and down and rotate, so that it can perform direction-change of the wafer W.

The buffers 50 and 52 disposed in the first compartment 46 on the lower vacuum side allow the second compartment 48 on the higher vacuum side to have a smaller volumetric capacity and thereby easily maintain a high vacuum. However, the buffers 50 and 52 may be disposed in the second compartment 48 on the higher vacuum side.

As shown in FIG. 2, the pressure control section PCS is connected to the first and second compartments 46 and 48. Specifically, gas feed ports 60A and 62A and exhaust ports 64 and 66 are formed in the bottoms of the first and second compartments 46 and 48. The gas feed ports 60A and 62A are respectively connected to gas feed sections 60 and 62 for controllably feeding an inactive gas, such as $N_2$ gas, or clean air. FIG. 2 shows a case where the gas feed sections 60 and 62 feed $N_2$ gas.

The exhaust ports 64 and 66 are respectively connected through short sleeves 72 and 74 to vacuum pumps 68 and 70, such as turbo-molecular pumps, that can vacuum-exhaust an objective inside to a high vacuum level. A line 76 extends from the delivery side of the vacuum pump 70 provided for the second compartment 48, and is connected to the sleeve 72 on the suction side of the vacuum pump 68 provided for the first compartment 46. An exhaust line 78 extends from the delivery side of the vacuum pump 68 and is connected to a vacuum pump 80, such as a dry pump. The vacuum pump 80 vacuum-exhausts the atmospheres inside the first and second compartments 46 and 48 together.

The gas feed sections 60 and 62, vacuum pumps 68, 70, and 80 are controlled by the controller CONT of the pressure control section PCS. As described previously, the controller CONT performs a setting such that the lowest operational pressure (ultimate pressure) of the second compartment 48 is lower (higher in vacuum) than the lowest operational pressure (ultimate pressure) of first compartment 46. The line 76 connecting the delivery side of the vacuum pump 70 of the second compartment 48 to the suction side of the vacuum pump 68 of the first compartment 46 makes it easy to form a predetermined pressure difference between the ultimate pressure of the second compartment 48 and the ultimate pressure of the first compartment 46. The ultimate pressure of second compartment 48 is set to be $1/10$ to $1/1000$, and preferably $1/100$ to $1/1000$, of the ultimate pressure of the first compartment 46. The ultimate pressure of the second compartment 48 is set to be $133 \times 10^{-6}$ to $133 \times 10^{-8}$ Pa, and preferably $133 \times 10^{-7}$ to $133 \times 10^{-8}$ Pa.

As shown in FIG. 2, the sleeves 72 and 74 disposed on the suction sides of the vacuum pumps 68 and 70 are respectively provided with cooling members 82 and 84, for cooling an atmosphere passing therethrough and adsorbing water molecules therein. Since the two cooling members 82 and 84 have the same structure, an explanation will be given of only one of them, e.g., the cooling member 82, as an example.

Figure 4:
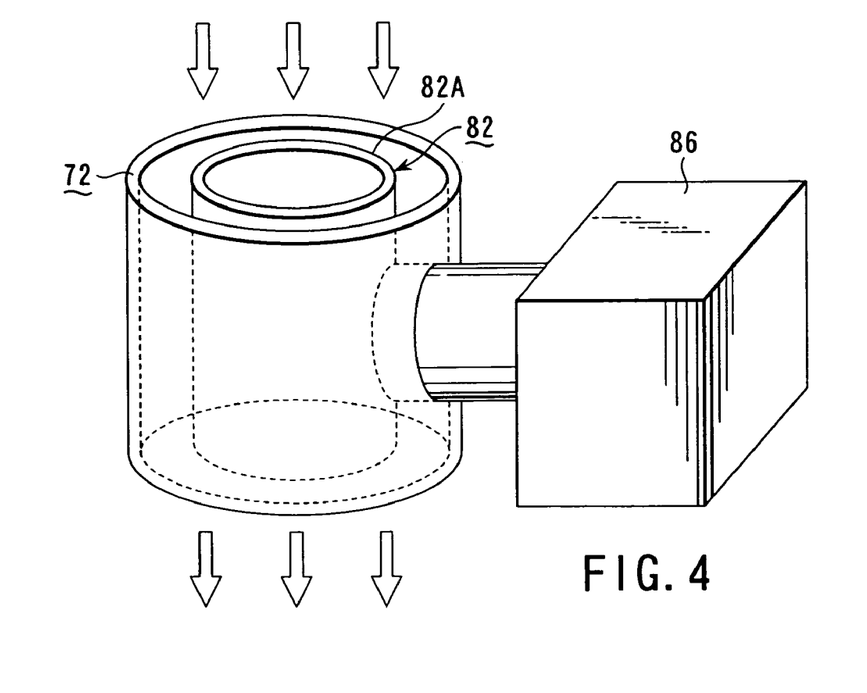
FIG. 4 is a perspective view showing a cooling member disposed on the suction side of a vacuum pump, which is used in the processing system shown in FIG. 1.

FIG. 4 is a perspective view showing the cooling member 82 (84) disposed on the suction side of a vacuum pump, which is used in the processing system shown in FIG. 1. As shown in FIG. 4, the cooling member 82 includes a cooling cylinder 82A disposed in and coaxially with the sleeve 72, and formed of, e.g., a stainless steel circular cylinder. The cooling cylinder 82A is connected to a cooling pump 86 disposed outside the sleeve 72. The cooling pump 86 supplies the cooling cylinder 82A with cold to cool the cooling cylinder 82A to, e.g., about 60 to 100K in absolute temperature.

Figure 5:
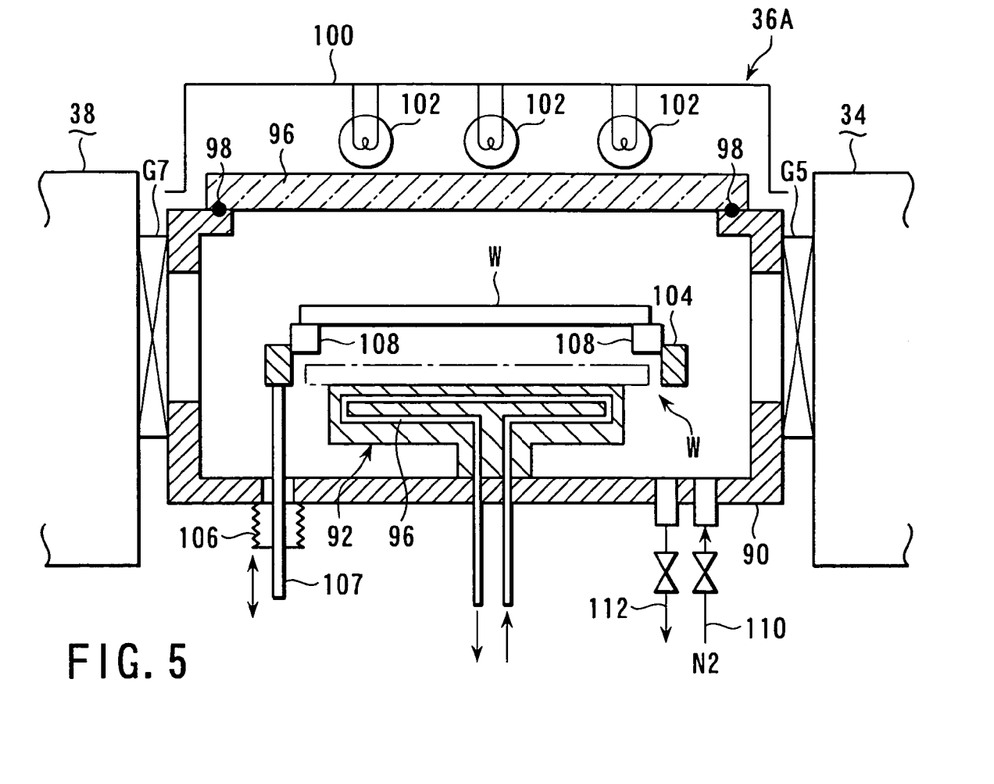
FIG. 5 is a sectional view showing a load-lock chamber used in the processing system shown in FIG. 1.
Figure 6:
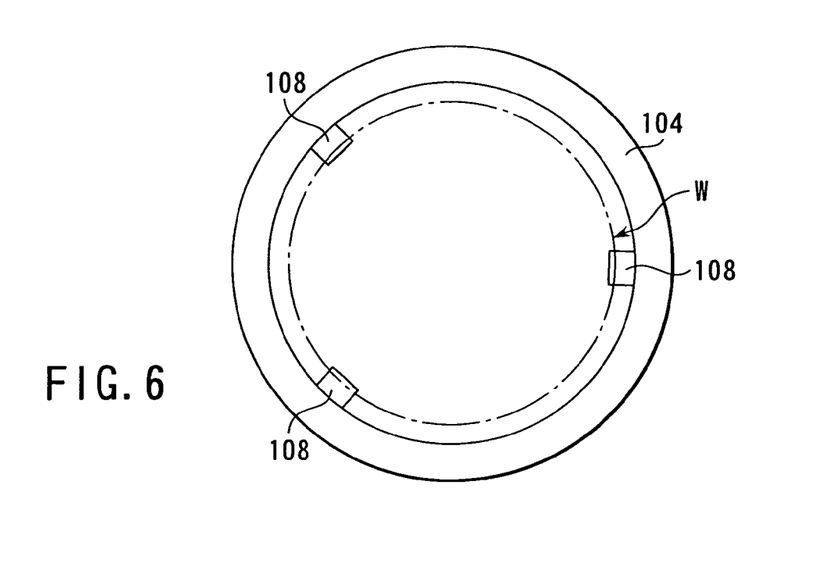
FIG. 6 is a plan view showing a substrate holding ring used in the load-lock chamber shown in FIG. 5.

FIG. 5 is a sectional view showing the load-lock chamber 36A (36B) used in the processing system shown in FIG. 1. FIG. 6 is a plan view showing a substrate holding ring used in the load-lock chamber 36A (36B) shown in FIG. 5. The load-lock chambers 36A and 36B have a structure almost the same as that disclosed in Jpn. Pat. Appln. KOKAI Publication No. 2000-208589. Since the two load-lock chambers 36A and 36B have the same structure, an explanation will be given of only one of them, e.g., the load-lock chamber 36A, as an example.

The load-lock chamber 36A has both a function of preheating a wafer, and a function of cooling a processed wafer that is in a heated state. More specifically, a circular cooling plate 92 is disposed in the container body 90 of the first load-lock chamber 36A, and is used as a worktable for a wafer W as well. For example, a cooling medium circulation passage 96 is formed in the cooling plate 92 for a cooling medium of a predetermined temperature to flow therein by means of circulation.

A transmission window 96 formed of, e.g., quartz is attached to the top of the load-lock chamber 36A, airtightly by a sealing member 98, such as an O-ring. A casing 100 with heating lamps 102A attached therein is disposed above the transmission window 96. The heating lamps 102 heat a wafer W, as needed.

A substrate holding ring 104 for holding a wafer W is disposed in the container body 90. The substrate holding ring 104 is connected to the top of an elevating rod 107, so that it can be moved up and down. The elevating rod 107 penetrates the bottom of the container body 90, at a portion covered with a contractive bellows 106 that maintains an airtight state. The substrate holding ring 104 has a diameter slightly larger than the cooling plate 92. As shown in FIG. 5, the substrate holding ring 104 is provided with a plurality of, e.g., three in this example, holding pins 108 disposed almost equidistantly on the inner side. The holding pins 108 support the peripheral edge of a wafer W, which is thereby held on the substrate holding ring 104.

There is a small gap between the inner ends of the holding pins 108, and the peripheral edge of the cooling plate 92, which is located further inside. Accordingly, the substrate holding ring 104 can be moved up and down around the cooling plate 92, so that a wafer W is transferred between the cooling plate 92 and itself.

A gas supply system 110 for supplying an inactive gas, such as $N_2$ gas, and a vacuum exhaust system 112 for vacuum-exhausting the inner atmosphere are connected to the container body 90. Each of the load-lock chambers 36A and 36B may be arranged to have no cooling or heating mechanisms, but have a function only of temporarily holding a wafer for transfer to the next stage after pressure adjustment.

Next, back to FIG. 1, the entrance transfer chamber 38 will be explained.

The entrance transfer chamber 38 is formed of a box having a long thin box-type configuration in which an inactive gas, such as $N_2$ gas, or clean air is circulated. Three loading ports are formed in one long side of the entrance transfer chamber 38, and are respectively connected through gate valves G10, G11, and G12 to cassette tables 120A, 120B, and 120C for a cassette.

The cassette tables 120A, 120B, and 120C are arranged to place cassettes 122A to 122C thereon, respectively. Each of the cassettes 122A to 122C is structured to store, e.g., 25 wafers W at most, at regular intervals. Each of the cassettes 122A to 122C has an airtight structure filled with, e.g., an $N_2$ gas atmosphere, but it may have a structure open to the atmosphere. Wafers are transferred between the cassette tables 120A to 120C and entrance transfer chamber 38 through the gate valves G10, G11, and G12.

The entrance transfer chamber 38 is provided with an entrance transfer arm device 124 disposed therein, for transferring wafers W in its longitudinal direction. The transfer arm device 124 is supported on and slides along a guide rail 126 that extends in the longitudinal direction at the center of the entrance transfer chamber 38. The guide rail 126 has an actuating mechanism, such as a linear motor, built therein. The linear motor moves the transfer arm device 124 on the guide rail 126 in an X-direction.

Two ports are formed in another long side of the entrance transfer chamber 38, and are connected, respectively through the gate valves G7 and G8 to be airtightly opened/closed, to the load-lock chambers 36A and 36B. An alignment device or orientor 128 for performing alignment on a wafer is disposed at one end of the entrance transfer chamber 38.

An orientor 128 includes a rotary table 130, which is rotated by a driving motor (not shown), along with a wafer W placed thereon. An optical sensor 132 is disposed beside the rotary table 130, for detecting the periphery of the wafer W. The optical sensor 132 is used to detect the direction and misalignment of the notch or orientation flat of the wafer W.

The transfer arm device 124 has two transfer arms 134 and 136 formed of articulated arms and disposed on upper and lower sides. The transfer arms 134 and 136 respectively have fork-like picks 134A and 136A at their distal ends, on each of which a wafer W is directly held. Each of the transfer arms 134 and 136 can extend and contract in a radial direction from the center. The transfer arms 134 and 136 can be controlled independently of each other to extend and contract.

The rotary shafts of the transfer arms 134 and 136 are rotatably and coaxially connected to a base 138. For example, these rotary shafts can rotate in a θ direction or rotation direction, integratedly relative to the base 138. Furthermore, these rotary shafts can move in a Z direction or vertical direction, integratedly relative to the base 138.

Next, an explanation will be given of a process performed, using the processing system 30 described above.

First, an unprocessed semiconductor wafer W is picked up from one of the cassettes placed on the three cassette tables 120A to 120C, e.g., the cassette 122C placed on the cassette table 120C. At this time, one of the transfer arms of the transfer arm device 124, e.g., the transfer arm 134, is operated to pick up and hold the wafer W by the pick 134A.

Then, with this state, the transfer arm device 124 is moved in the X-direction to transfer the wafer W to the orientor 128.

Then, the other transfer arm 136, which is unoccupied, is operated to pick up and hold, by the pick 136A, an unprocessed semiconductor wafer W, which has been transferred to the orientor 128 and aligned on the rotary table 130. As a consequence, the rotary table 130 becomes free. Then, the transfer arm 134 is operated to place the unprocessed wafer held on the pick 134A onto the unoccupied rotary table 130. This wafer is subjected to alignment by the time when a next unprocessed wafer is transferred thereto. Then, the transfer arm device 124 is moved in the X-direction to transfer the unprocessed wafer held on the other transfer arm 136, as described above, to one of the two load-lock chambers 36A and 36B, e.g., the load-lock chamber 36A.

At this time, a processed wafer that has been subjected to a predetermined process, such as a film-formation process or etching process, and has been sufficiently cooled, is waiting on the substrate holding ring 104 in the load-lock chamber 36A. The gate valve G7 is opened to open the load-lock chamber 36A, which has been adjusted in pressure. Then, the unoccupied transfer arm 134 is operated to pick up and hold, by the pick 134A, the processed wafer W waiting on the substrate holding ring 104. As a consequence, the substrate holding ring 104 becomes free. Then, the other transfer arm 136 is operated to place the unprocessed wafer held on the pick 136A onto the substrate holding ring 104. On the other hand, the processed wafer is returned back to the original cassette by the transfer arm device 124.

After the wafer W is placed on the substrate holding ring 104, the gate valve G7 is closed to make the load-lock chamber 36A airtight. Then, the wafer W is pre-heated for a predetermined to a predetermined temperature, to perform a degas process. Now, an explanation will be give of the cooling process and pre-heating process performed in the load-lock chambers 36A and 36B, with reference to FIGS. 5 and 6.

As shown in FIGS. 5 and 6, when a semiconductor wafer W having a high temperature is cooled, the substrate holding ring 104 is moved down, to place the wafer W on the cooling plate 92 in the container body 90. With this state, a thermo medium for cooling is caused to flow through the cooling medium circulation passage 96, thereby cooling the wafer on the cooling plate 92. This cooling is performed when the wafer is returned after it is processed in the vacuum processing apparatuses 32A to 32F.

When a semiconductor wafer W is pre-heated, the substrate holding ring 104 is moved up to set the wafer W to be closer to the heating lamps 102 above the ceiling. FIG. 5 shows a state at this time. With this state, the heating lamps 102 are turned on to rapidly pre-heat the wafer W to a predetermined temperature (degas process). During the degas process, the vacuum exhaust system 112 is operated to vacuum-exhaust the interior of the load-lock chamber 36A, so as to vacuum-exhaust gas, removed from the wafer surface, out of the system. The load-lock chambers 36A and 36B may be arranged to have no pre-heating mechanism or cooling mechanism. In this case, as a matter of course, no pre-heating, described above, or cooling, described later, can be performed.

After the degas process is performed for a predetermined time, as described above, the pressure in the load-lock chamber 36A is adjusted. Then, the gate valve G5 is opened to cause the load-lock chamber 36A to communicate with a first compartment 46 of the common transfer chamber 34, which has been set to have a vacuum atmosphere in advance. Then, the degas-processed wafer W is held by the first transfer arm device 40 disposed in the first compartment 46. At this time, if a processed wafer is held on one of the two picks 40A and 40B of the first transfer arm device 40, the processed wafer is replaced with the degas-processed wafer.

The degas-processed wafer W is then transferred into one of the two vacuum processing apparatuses 32E and 32F, e.g., the vacuum processing apparatus 32E. The vacuum processing apparatus 32E performs a predetermined process therein, such as a deoxidizing process (which is also called a pre-cleaning process) of a Cu film disposed on the wafer surface, by generating plasma within the presence of $H_2$ gas. The pre-cleaning process is performed at a process pressure of, e.g., about 2.66 to 13.3 Pa.

The wafer W thus pre-cleaned is temporarily placed on unoccupied one of the two buffers 50 and 52, e.g., the buffer 50. Then, the rotary table 58 is rotated, as needed, to set the orientation of the wafer to a predetermined direction. After the wafer W is temporarily placed on the buffer 50, the gate valve G30 corresponding to the buffer 50 is opened to cause the first and second compartments 46 and 48 to communicate with each other. Then, the pre-cleaned wafer W is transferred into the second compartment 48 by the second transfer arm device 42 disposed in the second compartment 48.

Then, the second transfer arm device 42 is operated to transfer the wafer W into a predetermined vacuum processing apparatus, e.g., 32A. The vacuum processing apparatus 32A performs a predetermined process therein, such as a film-formation process of Ta film, TaN film, or the like, by a so-called PVD process using plasma. Afterward, if the wafer is to be subjected to a plurality of processes, the wafer is transferred between the vacuum processing apparatuses 32B to 32D by the second transfer arm device 42. For example, the next vacuum processing apparatus 32B performs a film-formation process of a Cu film or the like by a PVD process using plasma.

During the operation described above, the pressure in the second compartment 48 is set slightly lower (higher in vacuum) than the pressure in the first compartment 46. Since the vacuum level of the second compartment 48 is higher, the quantity of contaminants entering the process chambers 32A to 32D from the second compartment 48 decreases, when the second compartment 48 comes to communicate with the process chambers 32A to 32D by opening the respective gate valves. As a consequence, the contaminant concentration in the PVD processes drops.

After all the necessary processes are completed, the wafer W is transferred out though a course reverse to that described above. Depending on the process, the temperature of the processed wafer W is as high as, e.g., about 600° C. Thus, the processed wafer W is transferred into an unoccupied one of the first and second load-lock chambers 36A and 36B, and sufficiently cooled down, as described above. At this time, the second transfer arm device 42 is first operated to transfer the wafer W to the buffer 50 or 52 through the opened gate valve G30 or G31. The first transfer arm device 40 is then operated to pick up and transfer the wafer W into an unoccupied one of the first and second load-lock chambers 36A and 36B. The wafer W is sufficiently cooled down in the load-lock chamber 36A or 36B, and is then returned to the original cassette by the transfer arm device 124 disposed in the entrance transfer chamber 38.

While a series of the wafer W transfer steps are performed, as described above, the common transfer chamber 34 is kept being vacuum-exhausted to maintain a predetermined vacuum level. Specifically, as shown in FIG. 2, the vacuum pumps 68 and 70 and vacuum pump 80 connected to the first and second compartments 46 and 48 are operated to vacuum-exhaust the atmospheres inside the compartments 46 and 48.

The exhaust line 76 of the vacuum pump 70 provided for the second compartment 48 extends to the suction side of the vacuum pump 68 provided for the other or first compartment 46. Accordingly, the interior of the second compartment 48 is vacuum-exhausted on the basis of the pressure inside the first compartment 46, i.e., in a so-called two-stage scheme. As a consequence, both of the compartments 46 and 48 are vacuum-exhausted, in a state where the vacuum level of the second compartment 48 is higher than the vacuum level of the first compartment 46. Since the second compartment 48 is vacuum-exhausted in a two-stage scheme, as described above, the second compartment 48 can be efficiently vacuum-exhausted to set it at a high vacuum level.

Furthermore, the suction sides of the two vacuum pumps 68 and 70 are respectively provided with the cooling members 82 and 84, which are cooled to 60 to 100K in absolute temperature. When water molecules in the atmosphere come into contact with the cooling members 82 and 84, they are cooled and thereby trapped. Since the partial pressure components of water molecules thus decrease, the entire vacuum level can become still higher.

The first compartment 46 is connected to the vacuum processing apparatuses 32E and 32F for performing a process within a relatively high process pressure, such as a pre-cleaning process using plasma excited in an $H_2$ gas atmosphere. On the other hand, the second compartment 48 is connected to the vacuum processing apparatuses 32A to 32D for performing a process within a relatively low process pressure, i.e., high in vacuum level, such as a film-formation process using plasma, i.e., a PVD process. As a consequence, when the pressure inside each of the first and second compartments 46 and 48 is adjusted relative to a corresponding vacuum processing apparatus for wafer transfer, the time period necessary for the pressure adjustment becomes shorter.

When one of the gate valves G30 and G31 partitioning the first compartment 46 and second compartment 48 is opened, the compartments 46 and 48 communicate with each other, thereby having the same pressure. At this time, since the second compartment 48 is vacuum-exhausted in a two-stage scheme, as described above, the second compartment 48 can be rapidly and efficiently vacuum-exhausted to have a pressure atmosphere of a predetermined high vacuum level.

Since there are two buffers 50 and 52 for wafer transfer, the wafer transfer speed increases. The interior of the common transfer chamber 34 is divided into a plurality of compartments 46 and 48, which can communicate with each other through the gate valves G30 and G31. This arrangement reduces inflow and outflow between the atmospheres of the two compartments 46 and 48 to a minimum, thereby suppressing cross-contamination therebetween.

In this embodiment, the vacuum level of the second compartment 48 is set to be higher than that of the first compartment 46. However, some of the features of this embodiment may be applied to a case where the second compartment 48 and first compartment 46 have vacuum levels almost the same as each other, or with a slight difference therebetween. In such a case, the delivery side of the vacuum pump of the second compartment 48 does not have to be connected to the suction side of the vacuum pump of the first compartment 48, but the first and second compartments 46 and 48 may have individual exhaust ports. Since the gate valves separate the first compartment 46 and second compartment 48 from each other, contaminants generated in a processing apparatus connected to one of the first and second compartments 46 and 48 are reliably prevented from entering the other compartment.

Figure 7:
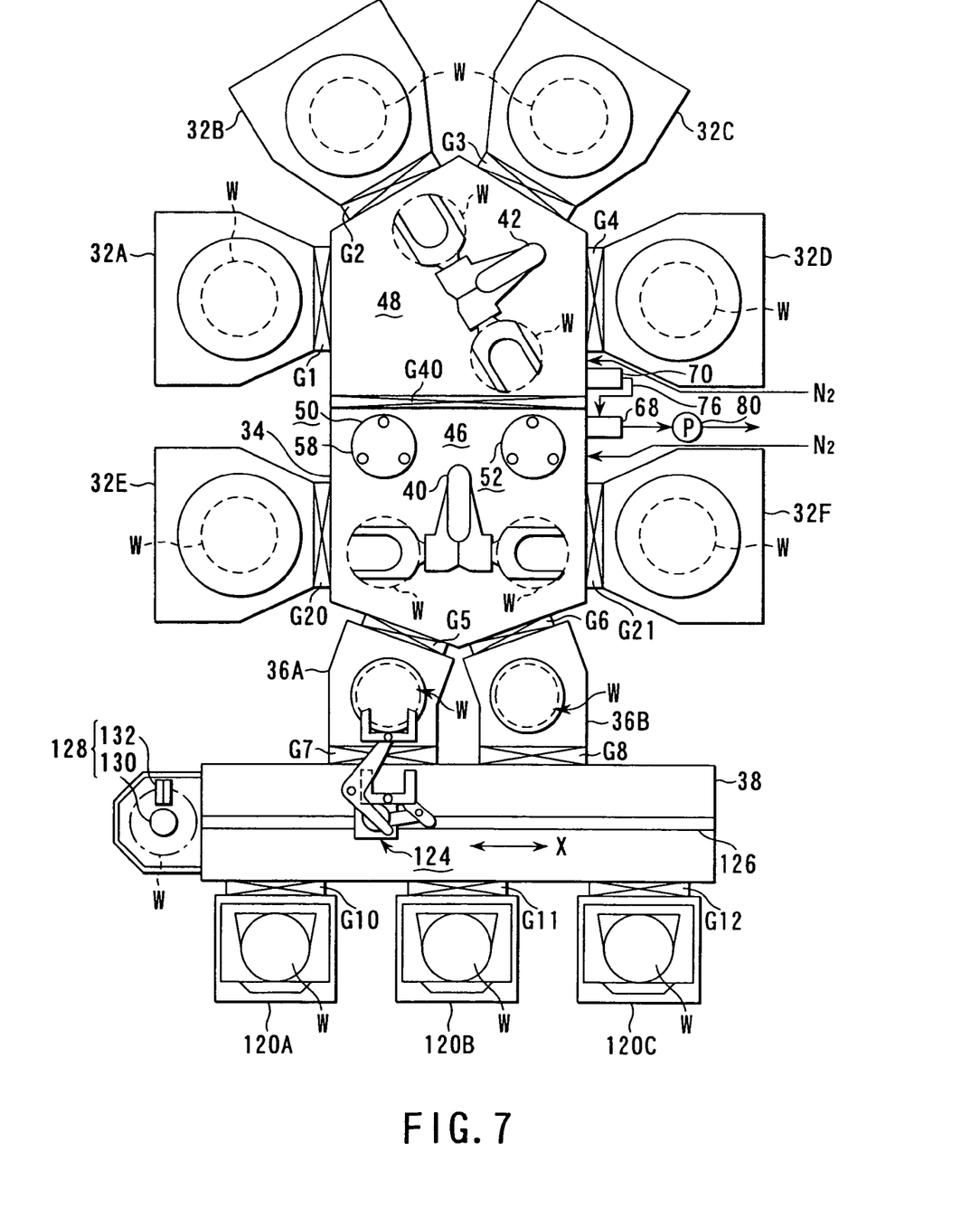
FIG. 7 is a schematic plan view showing a semiconductor processing system according to another embodiment of the present invention.

FIG. 7 is a schematic plan view showing a semiconductor processing system according to another embodiment of the present invention. In the semiconductor processing system shown in FIG. 1, the common transfer chamber 34 is divided into two compartments by the laterally extending partition wall 44, on which the two gate valves G30 and G31 are disposed. The common transfer chamber 34 may be divided by a partition wall formed of a gate valve having a laterally long shape. The semiconductor processing system shown in FIG. 7 is arranged in accordance with such an aspect.

In the semiconductor processing system shown in FIG. 7, a partition gate valve 40 having a laterally long shape is disposed to laterally cross the interior of a common transfer chamber 34, to divides the interior of the common transfer chamber 34 into first and second compartments 46 and 48. A wafer W is transferred between the first and second compartments 46 and 48 through the gate valve G40. The other structures of the semiconductor processing system shown in FIG. 7 are the same as those of the semiconductor processing system shown in FIG. 1. This arrangement allows the common transfer chamber 34 to have a simpler inner structure.

Figure 8:
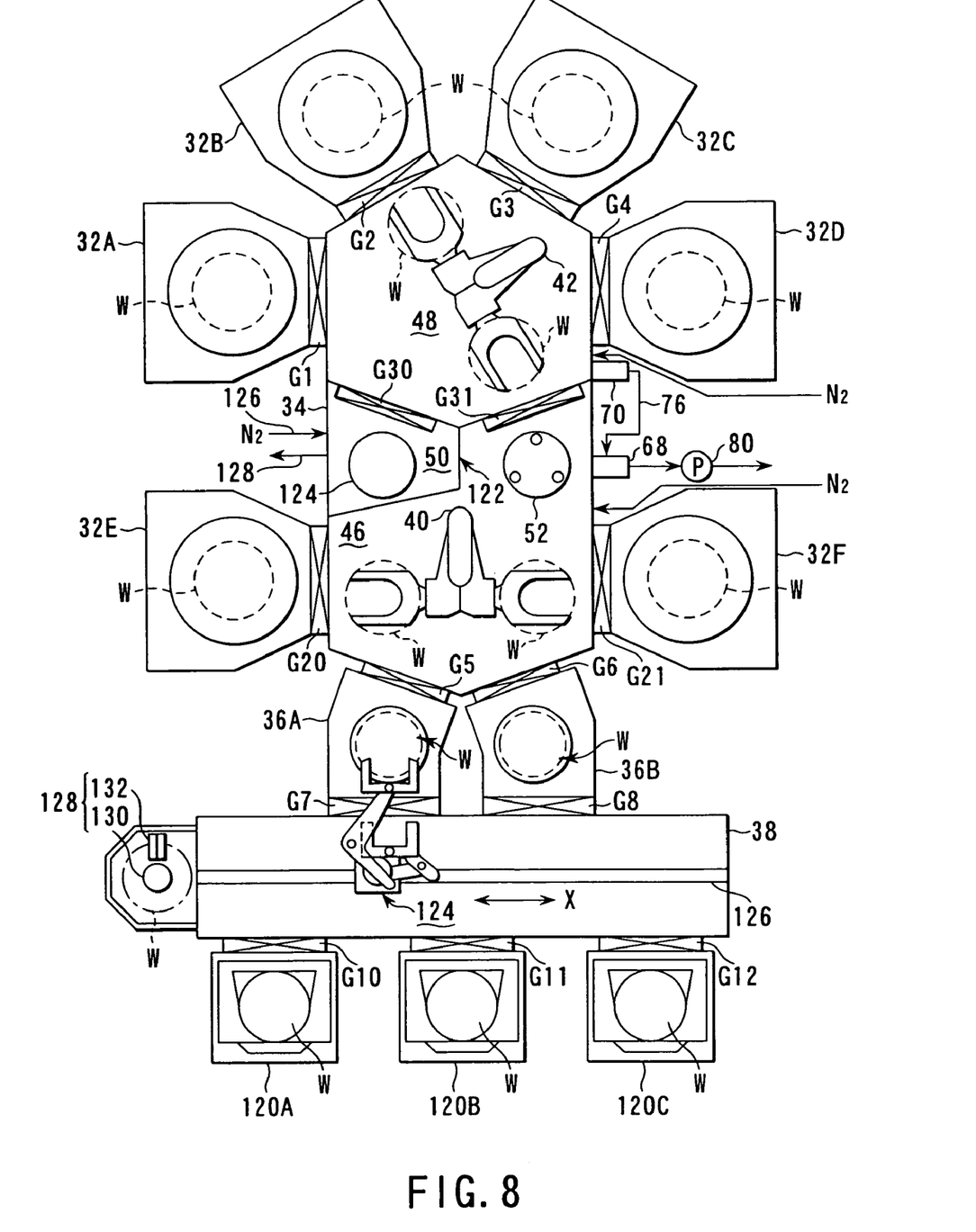
FIG. 8 is a schematic plan view showing a semiconductor processing system according to still another embodiment of the present invention.

FIG. 8 is a schematic plan view showing a semiconductor processing system according to still another embodiment of the present invention. In the semiconductor processing system shown in FIG. 1, the common transfer chamber is divided into two compartments by the laterally extending partition wall 44, on which the two gate valves G30 and G31 are disposed. Another compartment separated from the other compartments may be formed at one of the gate valves. The semiconductor processing system shown in FIG. 8 is arranged in accordance with such an aspect.

In the semiconductor processing system shown in FIG. 8, a buffer 50 corresponding to one of gate valves G30 and G31, e.g., a gate valve G30, is airtightly surrounded by a partition wall 122 to form an airtight space. In this case, this airtight space can be accessed only from a second compartment 48 through the gate valve 30.

The buffer 50 is provided with a wafer table 124 having heating means, such as a heater. The table 124 is used to pre-heat a wafer W to perform, e.g., a degas process. In this case, a gas supply system 126 and a gas exhaust system 128 are connected to the airtight space surrounding the buffer 50. A wafer W is transferred between the first and second compartments 46 and 48 through the other buffer 52 and gate valve G31. This arrangement allows a wafer to receive a degas process and so forth in the airtight space surrounding the buffer 50 disposed in a common transfer chamber 34.

Figure 9:
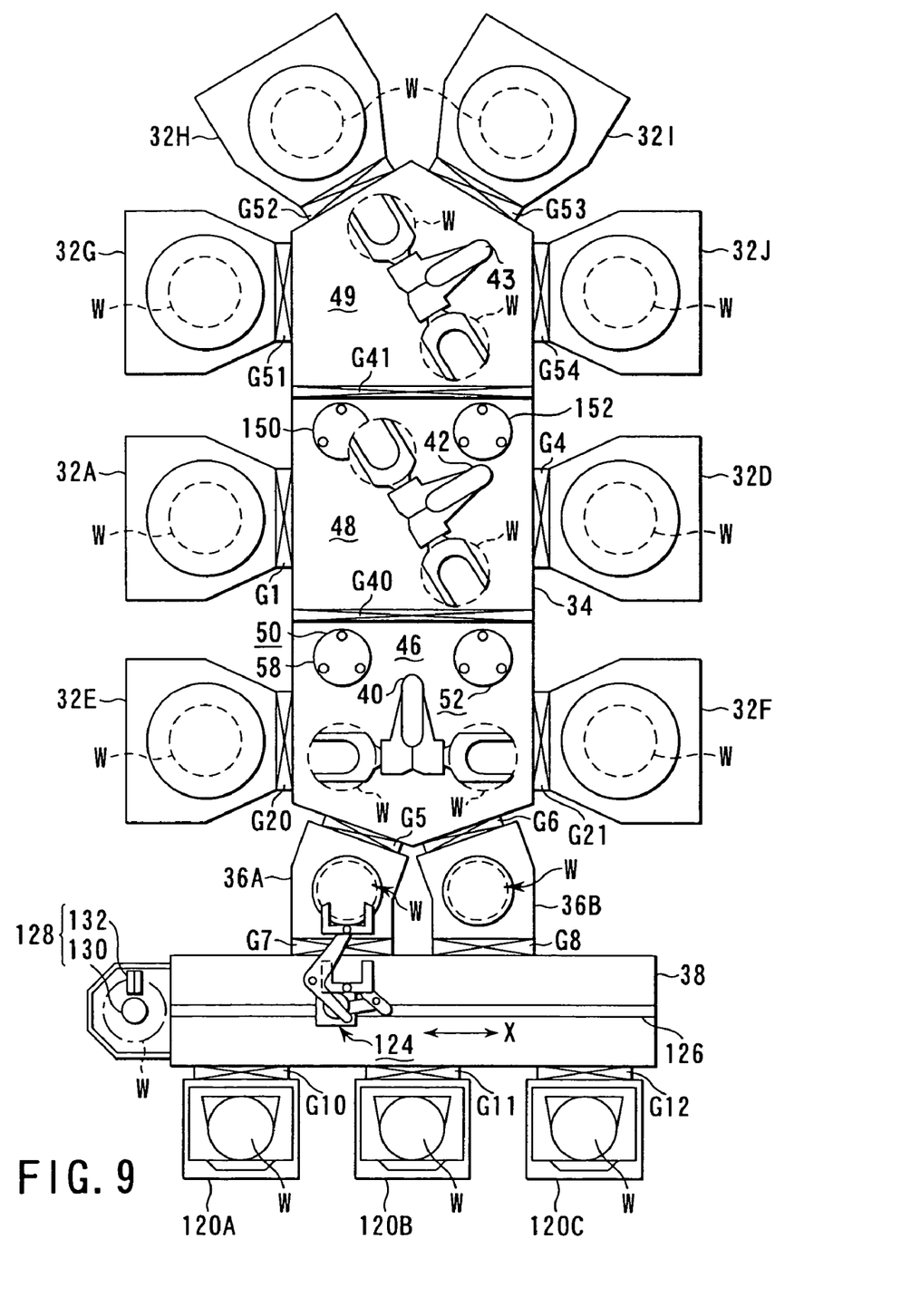
FIG. 9 is a schematic plan view showing a semiconductor processing system according to still another embodiment of the present invention.
Figure 10:
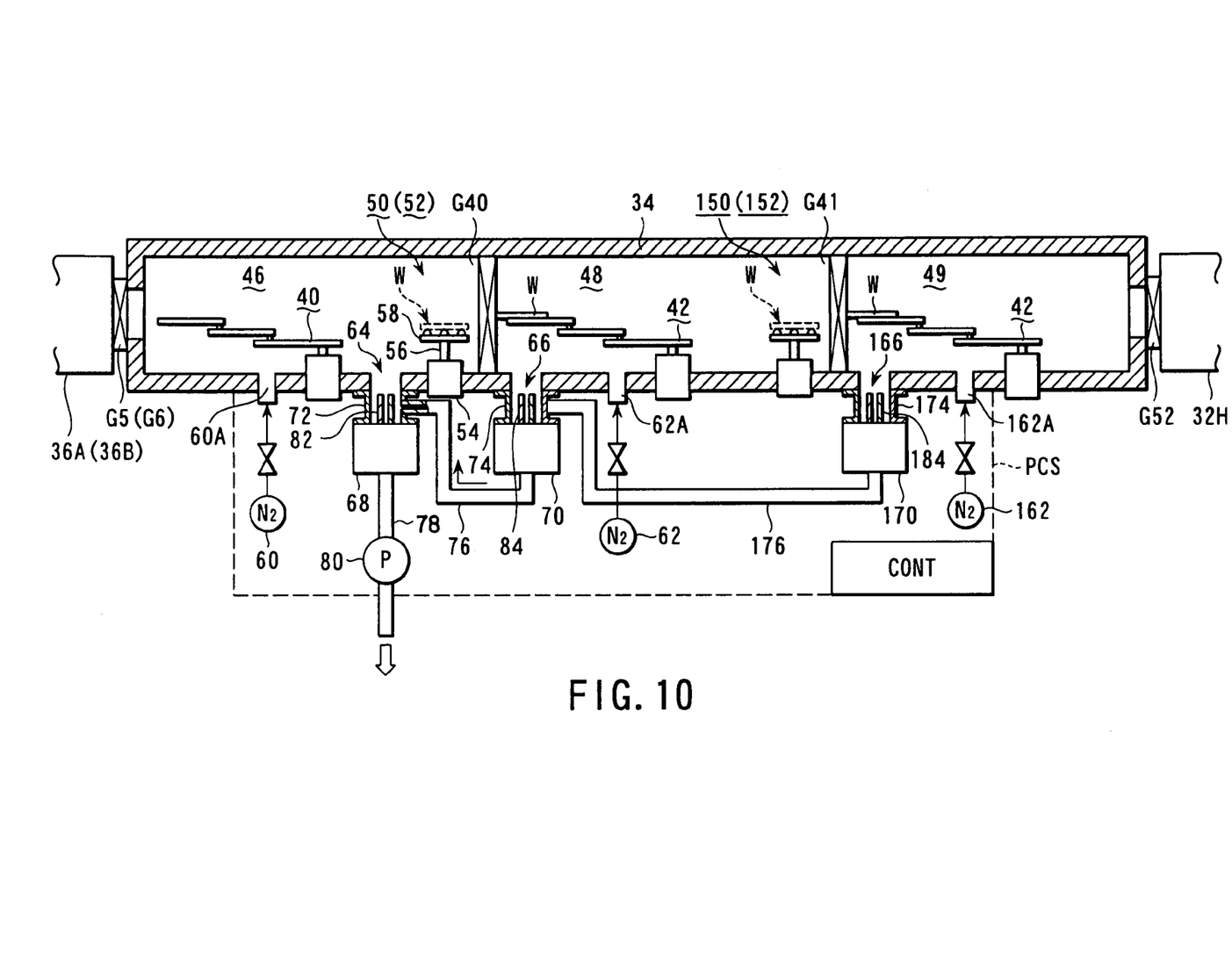
FIG. 10 is a sectional view showing the common transfer chamber of the processing system shown in FIG. 9.

FIG. 9 is a schematic plan view showing a semiconductor processing system according to still another embodiment of the present invention. FIG. 10 is a sectional view showing the common transfer chamber of the processing system shown in FIG. 9. In the semiconductor processing systems according to the embodiments described above, the common transfer chamber 34 is divided into two compartments. The common transfer chamber may be divided into three or more compartments. The semiconductor processing system shown in FIGS. 9 and 10 is arranged in accordance with such an aspect. Also in this case, vacuum pumps are respectively provided for the compartments, and the delivery side of each vacuum pump is connected to the suction side of the next vacuum pump immediately next thereto in terms of pressure, in decreasing order of the vacuum level of the compartments.

As shown in FIG. 9, in this semiconductor processing system, the interior of a common transfer chamber 34 is airtightly divided into first, second, and third compartments 46, 48, and 49 by two gate valves G40 and G41 functioning as partition walls. The gate valves G40 and G41 are disposed in parallel with each other to cross the longitudinal direction of the common transfer chamber 34 at two positions. Each of the gate valves G40 and G41 is substantially the same as the gate valve G40 shown in FIG. 7.

Under the control of a pressure control section PCS described later, the first and second compartments 46 and 48 partitioned by the gate valve G40 are set to have the same relationship in pressure as the semiconductor processing systems shown in FIGS. 1, 7 and 8. Furthermore, the lowest operational pressure (ultimate pressure) of the third compartment 49 partitioned from the second compartment 48 by the gate valve G41 is set to be lower (higher in vacuum) than the lowest operational pressure (ultimate pressure) of the second compartment 46.

Two vacuum processing apparatuses 32E and 32F are connected to the first compartment 46 through gate valves G20 and G21, respectively. Two vacuum processing apparatuses 32A and 32D are connected to the second compartment 48 through gate valves G1 and G4, respectively. Four vacuum processing apparatus 32G to 32J are connected to the third compartment 49 through gate valves G51 to G54, respectively. The four vacuum processing apparatuses 32G to 32J connected to the third compartment 49 respectively perform semiconductor processes at process pressures lower (higher in vacuum) than those of the two vacuum processing apparatuses 32A and 32D connected to the second compartment 48.

The third compartment 49 is also provided with a third transfer arm device 43 disposed therein, which is formed of an articulated structure that can extend, contract, move up and down, and rotate, in the same manner as the first and second transfer arm devices 40 and 42. The third transfer arm device 43 is arranged to access the four vacuum processing apparatus 32G to 32J.

Two buffers 150 and 152 each for temporarily holding a wafer W are disposed within that area (accessible area) in the second compartment 48 where the transfer ranges of the second and third transfer arm devices 42 and 43 overlap with each other. Each of the two buffers 150 and 152 has the same structure as the buffers 50 and 52 used in the semiconductor processing system shown in FIG. 1.

As shown in FIG. 10, a pressure control section PCS is connected to the first, second, and third compartments 46, 48, and 49. As in the first and second compartments 46 and 48, a gas feed port 162A and an exhaust port 166 are formed in the bottom of the third compartment. The gas feed port 162A is connected to a gas feed section 162 for controllably feeding an inactive gas, such as $N_2$ gas, or clean air.

The exhaust port 166 is connected through a short sleeve 174 to a vacuum pump 170, such as a turbo-molecular pump, that can vacuum-exhaust an objective inside to a high vacuum level. The sleeve 174 is provided with a cooling member 184 disposed therein, for cooling an atmosphere passing therethrough and adsorbing water molecules therein. The cooling members 184 has the same structure as the cooling members 82 and 84 used in the semiconductor processing system shown in FIG. 1.

A line 176 extends from the delivery side of the vacuum pump 170 provided for the third compartment 49, and is connected to the sleeve 74 on the suction side of the vacuum pump 70 provided for the second compartment 48. A line 76 extends from the delivery side of the vacuum pump 70 provided for the second compartment 48, and is connected to the sleeve 72 on the suction side of the vacuum pump 68 provided for the first compartment 46. An exhaust line 78 extends from the delivery side of the vacuum pump 68 and is connected to a vacuum pump 80, such as a dry pump. The vacuum pump 80 vacuum-exhausts the atmospheres inside the first, second, and third compartments 46, 48, and 49 together.

The gas feed sections 60, 62, and 162, vacuum pumps 68, 70, 170, and 80 are controlled by the controller CONT of the pressure control section PCS. The controller CONT performs a setting such that the lowest operational pressures (ultimate pressures) of the third, second, and first compartments 49, 48, and 46 are arranged to gradually increase in this order (decreasing order of the vacuum level). The pressure difference between the ultimate pressure of the second compartment 48 and the ultimate pressure of the first compartment 46, and the ultimate pressure of the second compartment 48 are set to be the same as those in the semiconductor processing system shown in FIG. 1. The ultimate pressure of the third compartment 49 is set to be ½ to ⅒, and preferably ⅕ to ⅒, of the ultimate pressure of the second compartment 48. Furthermore, the ultimate pressure of the third compartment 49 is set to be $133 \times 10^{-7}$ to $133 \times 10^{-9}$ Pa, and preferably $133 \times 10^{-8}$ to $133 \times 10^{-9}$ Pa.

In the semiconductor processing system shown in FIGS. 9 and 10, the interior of the third compartment 49 is vacuum-exhausted on the basis of the pressures inside the first and second compartments 46 and 48, i.e., in a so-called three-stage scheme. As a consequence, the third compartment 49 can be efficiently vacuum-exhausted to set it at a high vacuum-level. The common transfer chamber 34 is divided into the first, second, and third compartments 46, 48, and 49, in accordance with the respective process pressures of the vacuum processing apparatuses. As a consequence, when the pressure inside each of the compartments is adjusted relative to a corresponding vacuum processing apparatus, the time period necessary for the pressure adjustment becomes shorter.

In the embodiments described above, the explained pressures of the first, second, and third compartments 46, 48, and 49 are only examples. Also, the explained processes to be performed in the vacuum processing apparatus 32A to 32J are only examples. Furthermore, in the embodiments described above, a semiconductor wafer W is handled as a target substrate. Alternatively, the present invention may be applied to a glass substrate or LCD substrate.

According to the embodiments described above, a common transfer chamber is divided into a plurality of compartments, and the delivery side of a vacuum pump provided for a compartment to have a higher vacuum level is connected to the suction side of a vacuum pump provided for a compartment to have a lower vacuum level. As a consequence, a simply structured system can have a plurality of compartments with different vacuum levels, while preventing the entire structure of the system from being complicated so much. Furthermore, processing apparatuses are connected to the compartments such that the vacuum levels of the respective compartments correspond to the process pressures of the processing apparatuses. As a consequence, the time period necessary for pressure adjustment becomes shorter.

The invention claimed is:

1. A semiconductor processing system comprising:
an airtight common transfer chamber;
a partition wall that partitions an interior of the common transfer chamber and forms first and second compartments inside the common transfer chamber, the partition wall including a gate valve configured to selectively cause the first and second compartments to communicate with each other;
a first vacuum processing apparatus connected to the first compartment, and configured to process a target substrate at a first process pressure therein;
a second vacuum processing apparatus connected to the second compartment, and configured to process the target substrate at a second process pressure therein, the second process pressure being lower than the first process pressure;
first and second load-lock chambers configured to adjust pressure therein, and connected to the first compartment;
a first transfer arm device disposed in the first compartment to transfer the target substrate into the first vacuum processing apparatus;
a second transfer arm device disposed in the second compartment to transfer the target substrate into the second vacuum processing apparatus;
a buffer disposed within at least one of the first and second compartments to temporarily hold the target substrate, and located to be accessible by the first and second transfer arm devices; and
a pressure control section configured to control pressure inside the first and second compartments, wherein the pressure control section comprises first and second vacuum pumps respectively connected to the first and second compartments, each of the first and second vacuum pumps configured to vacuum-exhaust an inside of its respective compartment to a high vacuum level, a line connecting a delivery side of the second vacuum pump to a suction side of the first vacuum pump, and a third vacuum pump connected downstream from the first vacuum pump and commonly used for the first and second compartments, and the pressure control section performs a setting such that a second ultimate pressure, which is a lowest operational pressure of the second compartment, is lower than a first ultimate pressure, which is a lowest operational pressure of the first compartment.

2. The semiconductor processing system according to claim 1, wherein the pressure control section sets the second ultimate pressure at $133 \times 10^{-6}$ to $133 \times 10^{-8}$ Pa.

3. The semiconductor processing system according to claim 1, wherein the pressure control section sets the second ultimate pressure to be ($1/10$) to ($1/1000$) of the first ultimate pressure.

4. The semiconductor processing system according to claim 1, wherein the buffer is disposed in the first compartment.

5. The semiconductor processing system according to claim 1, wherein the gate valve substantially entirely occupies the partition wall.

6. The semiconductor processing system according to claim 1, wherein the gate valve partly occupies the partition wall.

7. The semiconductor processing system according to claim 1, wherein each of the first and second vacuum pumps has a suction side provided with a cooling member configured to adsorb water molecules in an atmosphere by cooling.

8. The semiconductor processing system according to claim 1, further comprising an entrance transfer chamber with an atmospheric pressure atmosphere, connected to the first and second load-lock chambers in common, and having a loading port for transferring a target substrate into the semiconductor processing system there through.

9. A semiconductor processing system comprising:
an airtight common transfer chamber;
a partition wall that partitions an interior of the common transfer chamber and forms first and second compartments inside the common transfer chamber, the partition wall including a gate valve configured to selectively cause the first and second compartments to communicate with each other;
a first vacuum processing apparatus connected to the first compartment, and configured to process a target substrate at a first process pressure therein;
a second vacuum processing apparatus connected to the second compartment, and configured to process the target substrate at a second process pressure therein, the second process pressure being lower than the first process pressure;
first and second load-lock chambers configured to adjust pressure therein, and connected to the first compartment;
a first transfer arm device disposed in the first compartment to transfer the target substrate into the first vacuum processing apparatus;
a second transfer arm device disposed in the second compartment to transfer the target substrate into the second vacuum processing apparatus;
a buffer disposed within at least one of the first and second compartments to temporarily hold the target substrate, and located to be accessible by the first and second transfer arm devices;
a pressure control section configured to control pressure inside the first and second compartments, wherein the pressure control section comprises first and second vacuum pumps respectively connected to the first and second compartments, and a line connecting a delivery side of the second vacuum pump to a suction side of the first vacuum pump, and performs a setting such that a second ultimate pressure, which is a lowest operational pressure of the second compartment, is lower than a first ultimate pressure, which is a lowest operational pressure of the first compartment;
a second partition wall that partitions the interior of the common transfer chamber and forms a third compartment adjacent to the second compartment inside the common transfer chamber, the second partition wall including a gate valve configured to selectively cause the second and third compartments to communicate with each other;
a third vacuum processing apparatus connected to the third compartment, and configured to process the target substrate at a third process pressure therein, the third process pressure being lower than the second process pressure; and
a third transfer arm device disposed in the third compartment to transfer the target substrate into the third vacuum processing apparatus,
wherein the pressure control section is configured to control pressure inside the third compartment, comprises a third fourth vacuum pump connected to the third compartment, and a line connecting a delivery side of the third vacuum pump to a suction side of the second vacuum pump, and performs a setting such that a third ultimate pressure, which is a lowest operational pressure of the third compartment, is lower than the second ultimate pressure.

10. The semiconductor processing system according to claim 9, wherein the pressure control section sets the third ultimate pressure at $133\times10^{-7}$ to $133\times10^{-9}$ Pa.

11. The semiconductor processing system according to claim 9, wherein the pressure control section sets the third ultimate pressure to be ½ to ¹⁄₁₀ of the second ultimate pressure.

12. A semiconductor processing system comprising:
an airtight common transfer chamber;
a partition wall that partitions an interior of the common transfer chamber and forms first and second compartments inside the common transfer chamber, the partition wall including a gate valve configured to selectively cause the first and second compartments to communicate with each other;
first and second vacuum processing apparatuses respectively connected to the first and second compartments;
first and second load-lock chambers configured to adjust pressure therein, and connected to the first compartment;
first and second transfer arm devices respectively disposed in the first and second compartments to transfer the target substrate into the first and second vacuum processing apparatuses;
a buffer disposed within at least one of the first and second compartments to temporarily hold the target substrate, and located to be accessible by the first and second transfer arm devices; and
a pressure control section configured to control pressure inside the first and second compartments, wherein the pressure control section comprises first and second vacuum pumps respectively connected to the first and second compartments, each of the first and second vacuum pumps configured to vacuum-exhaust an inside of its respective compartment to a high vacuum level, a line connecting a delivery side of the second vacuum pump to a suction side of the first vacuum pump, and a third vacuum pump connected downstream from the first vacuum pump and commonly used for the first and second compartments, and the pressure control section performs a setting such that a second ultimate pressure, which is a lowest operational pressure of the second compartment, is lower than a first ultimate pressure, which is a lowest operational pressure of the first compartment.

13. The semiconductor processing system according to claim 12, wherein the pressure control section sets a second ultimate pressure, which is a lowest operational pressure of the second compartment, at $133\times10^{-6}$ to $133\times10^{-8}$ Pa.

14. The semiconductor processing system according to claim 12, wherein the pressure control section sets the second ultimate pressure to be ¹⁄₁₀ to ¹⁄₁₀₀₀ of a first ultimate pressure, which is a lowest operational pressure of the first compartment.

15. The semiconductor processing system of claim 1, wherein each of the first and second vacuum pumps is a turbo-molecular pump.

16. The semiconductor processing system according to claim 15, wherein the third vacuum pump is a dry pump.

17. The semiconductor processing system according to claim 12, wherein each of the first and second vacuum pumps is a turbo-molecular pump.

18. The semiconductor processing system according to claim 17, wherein the third vacuum pump is a dry pump.

19. The semiconductor processing system according to claim 1, wherein the pressure control section further comprises a fourth vacuum pump connected downstream from the first vacuum pump and commonly used for the first and second compartments and a third compartment.

20. The semiconductor processing system according to claim 19, wherein each of the first, second, and third vacuum pumps is a turbo-molecular pump.

* * * * *